(12) United States Patent
Lee et al.

(10) Patent No.: US 12,295,100 B2
(45) Date of Patent: May 6, 2025

(54) PRINTED CIRCUIT BOARD INCLUDING BONDING LAYER, HAVING CONDUCTIVE PARTICLES, DISPOSED BETWEEN CORE PORTIONS

(71) Applicant: SAMSUNG ELECTRO-MECHANICS CO., LTD., Suwon-si (KR)

(72) Inventors: Sang Yoon Lee, Suwon-si (KR); Seung Eun Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 266 days.

(21) Appl. No.: 18/118,217

(22) Filed: Mar. 7, 2023

(65) Prior Publication Data

US 2024/0147622 A1    May 2, 2024

(30) Foreign Application Priority Data

Oct. 26, 2022    (KR) .................... 10-2022-0139297

(51) Int. Cl.
*H05K 1/14*    (2006.01)
*H05K 1/02*    (2006.01)
*H05K 1/18*    (2006.01)

(52) U.S. Cl.
CPC ............ *H05K 1/14* (2013.01); *H05K 1/0298* (2013.01); *H05K 1/144* (2013.01); *H05K 1/185* (2013.01); *H05K 2201/041* (2013.01); *H05K 2201/10015* (2013.01); *H05K 2201/10984* (2013.01); *H05K 2201/2081* (2013.01)

(58) Field of Classification Search
CPC .......... H05K 1/115; H05K 1/14; H05K 1/185; H05K 1/0298; H05K 1/03; H05K 1/09; H05K 1/111; H05K 1/144; H05K 3/282; H05K 3/323; H05K 3/4602; H05K 3/4623; H05K 3/4644; H05K 3/4697; H05K 2201/041; H05K 2201/10015; H05K 2201/10984; H05K 2201/2081
USPC ........................................................ 361/761
See application file for complete search history.

(56) References Cited

U.S. PATENT DOCUMENTS

| | | | |
|---|---|---|---|
| 10,881,004 B1 | 12/2020 | Lee et al. | |
| 2009/0294056 A1* | 12/2009 | Yoshimura | H05K 3/4614 156/327 |
| 2015/0027757 A1* | 1/2015 | Shin | H05K 3/107 174/255 |
| 2017/0231094 A1* | 8/2017 | Blackshear | H05K 1/185 |
| 2021/0151381 A1* | 5/2021 | Huang | H01L 23/5386 |
| 2022/0102453 A1* | 3/2022 | Chen | H01L 25/167 |

FOREIGN PATENT DOCUMENTS

| | | |
|---|---|---|
| JP | 2012-092321 A | 5/2012 |
| JP | 2017-143254 A | 8/2017 |
| KR | 2021-100076582 A | 6/2021 |

* cited by examiner

*Primary Examiner* — Timothy J Thompson
*Assistant Examiner* — Michael F McAllister
(74) *Attorney, Agent, or Firm* — MORGAN, LEWIS & BOCKIUS LLP (57) ABSTRACT

A printed circuit board includes a first core portion in which a first passive component is embedded, a second core portion in which a second passive component is embedded, and a first bonding layer disposed between the first and second core portions and including first conductive particles connected to the first and second passive components.

21 Claims, 6 Drawing Sheets

PRINTED CIRCUIT BOARD INCLUDING BONDING LAYER, HAVING CONDUCTIVE PARTICLES, DISPOSED BETWEEN CORE PORTIONS

CROSS-REFERENCE TO RELATED APPLICATION(S)

This application claims benefit of priority to Korean Patent Application No. 10-2022-0139297 filed on Oct. 26, 2022 in the Korean Intellectual Property Office, the disclosure of which is incorporated herein by reference in its entirety.

TECHNICAL FIELD

The present disclosure relates to a printed circuit board, for example, a printed circuit board having a plurality of passive components embedded therein.

In printed circuit boards for semiconductor packages, to secure Power Integrity (PI) characteristics, Die Side Capacitor (DSC), Land Side Capacitor (LSC) and the like have been mounted on the surface of the board, and recently, an Embedded Passive Substrate (EPS) structure has been actively adopted.

SUMMARY

An aspect of the present disclosure is to provide a printed circuit board in which an EPS structure may be more easily implemented and PI characteristics may be improved.

An aspect of the present disclosure is to provide an upper and lower electrical connection path by embedding passive components in the plurality of respective core portions and then bonding the plurality of core portions in a vertical direction using a bonding layer containing conductive particles.

According to an aspect of the present disclosure, a printed circuit board includes a first core portion in which a first passive component is embedded; a second core portion in which a second passive component is embedded; and a first bonding layer disposed between the first and second core portions and including first conductive particles connected to the first and second passive components.

According to an aspect of the present disclosure, a printed circuit board includes a first core substrate including a first core insulating layer having a first through-hole, a first passive component disposed in the first through-hole and including a first electrode, a first encapsulant covering at least a portion of each of the first core insulating layer and the first passive component, first and second core wiring layers disposed on upper and lower surfaces of the first encapsulant, respectively, first and second core vias respectively passing through at least a portion of the first encapsulant, on upper and lower sides of the first passive component, and respectively connecting the first electrode to the first and second core wiring layers, and a third core via passing through the first core insulating layer and the first encapsulant and connecting the first and second core wiring layers; a second core substrate including a second core insulating layer having a second through-hole, a second passive component disposed in the second through-hole and including a second electrode, a second encapsulant covering at least a portion of each of the second core insulating layer and the second passive component, third and fourth core wiring layers disposed on upper and lower surfaces of the second encapsulant respectively, fourth and fifth core vias respectively passing through at least a portion of the second encapsulant, on upper and lower sides of the second passive component, and respectively connecting the second electrode to the third and fourth core wiring layers, and a sixth core via passing through the second core insulating layer and the second encapsulant and connecting the third and fourth core wiring layers; and a first bonding layer disposed between the first and second core substrates and including first conductive particles connected to the first and second electrodes.

According to an aspect of the present disclosure, a printed circuit board includes a bonding layer including an insulating resin and conductive particles randomly dispersed in the insulating resin; a first passive component disposed on one side of the bonding layer; and a second passive component disposed on another side of the bonding layer such that the bonding layer is disposed between the first passives component and the second passive component. The first passive component and the second passive component at least partially overlap each other in a laminating direction of the printed circuit board, and are connected to each other through at least one or more of the conductive particles disposed between the first passive component and the second passive component.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, the present disclosure will be described with reference to the accompanying drawings. The shapes and sizes of elements in the drawings may be exaggerated or reduced for clearer description.

Electronic Device

Figure 1:
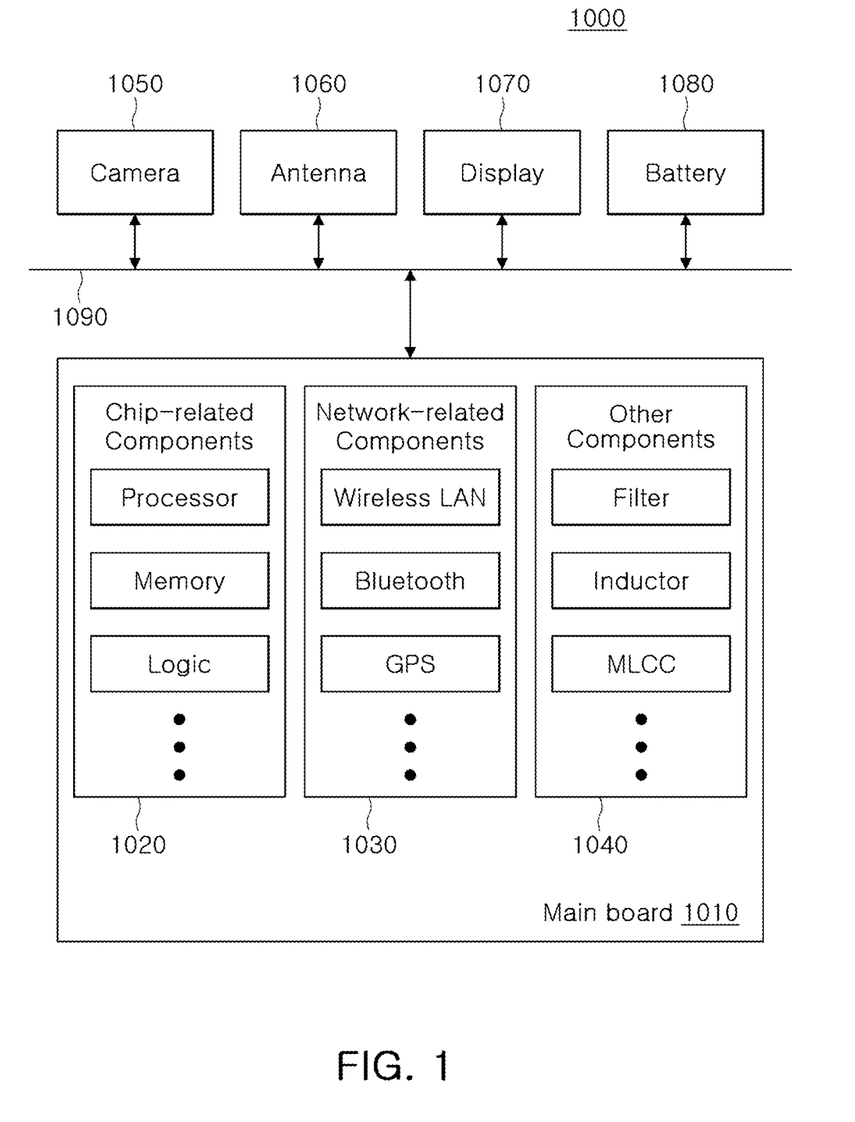
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related electronic components 1020 are not limited thereto, but may also include other types of chip related electronic components. In addition, the chip related components 1020 may be combined with each other. The chip-related component 1020 may be in the form of a package including the aforementioned chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive elements in the form of chip components used for various other purposes or the like. In addition, other components 1040 may be combined with the chip related components 1020 and/or the network related components 1030, of course.

Depending on a type of the electronic device 1000, the electronic device 1000 may include other electronic components that may or may not be physically or electrically connected to the mainboard 1010. Examples of these other electronic components may include, for example, a camera module 1050, an antenna module 1060, a display device 1070, a battery 1080, and the like, but without being limited thereto, also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, and the like. These other components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
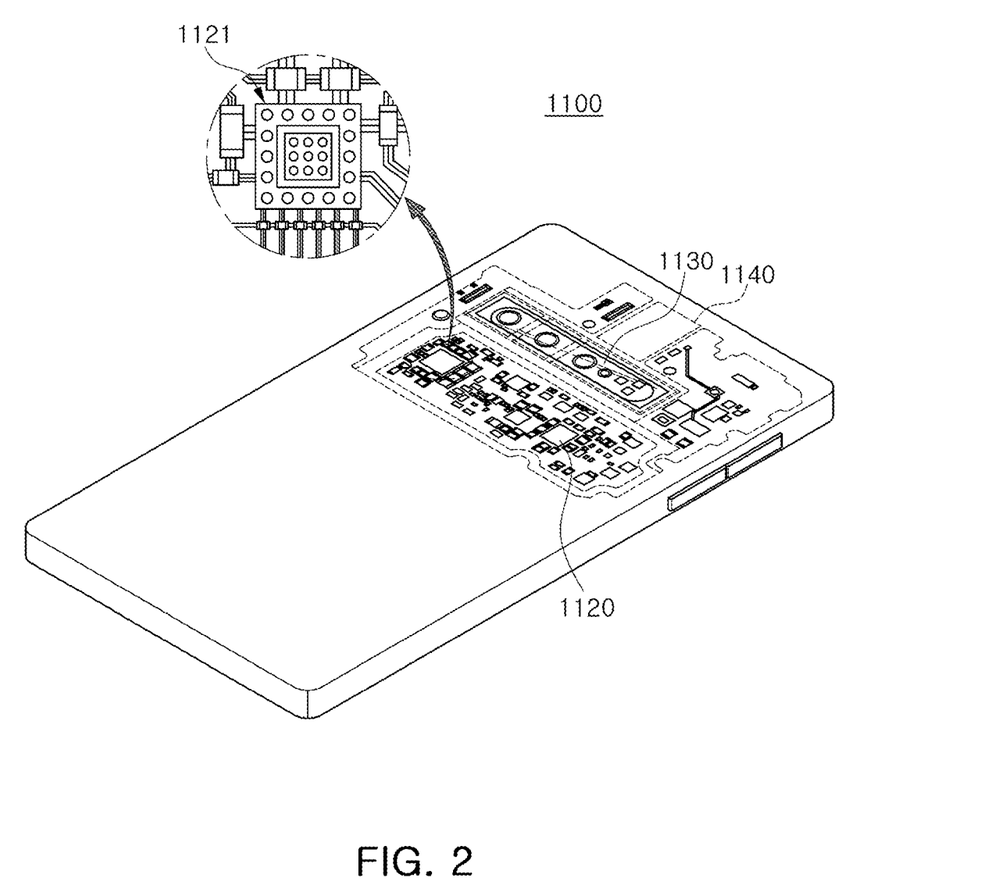
FIG. 2 is a perspective view schematically illustrating an example of an electronic device.

FIG. 2 is a schematic perspective view illustrating an example of an electronic device.

Referring to FIG. 2, electronic devices may be, for example, a smartphone 1100. A motherboard 1110 may be accommodated inside the smartphone 1100, and various components 1120 may be physically or electrically connected to the motherboard 1110. In addition, other components that may or may not be physically and/or electrically connected to the motherboard 1110, such as a camera module 1130 and/or a speaker 1140, may be accommodated in the inside of the smartphone. Some of the components 1120 may be the aforementioned chip-related components, for example, a component package 1121, but is not limited thereto. The component package 1121 may be in the form of a printed circuit board on which electronic components including active components and/or passive components are surface mounted. Alternatively, the component package 1121 may be in the form of a printed circuit board in which active components and/or passive components are embedded. On the other hand, the electronic device is not necessarily limited to the smartphone 1100, and may be other electronic devices as described above, of course.

Printed Circuit Board

Figure 3:
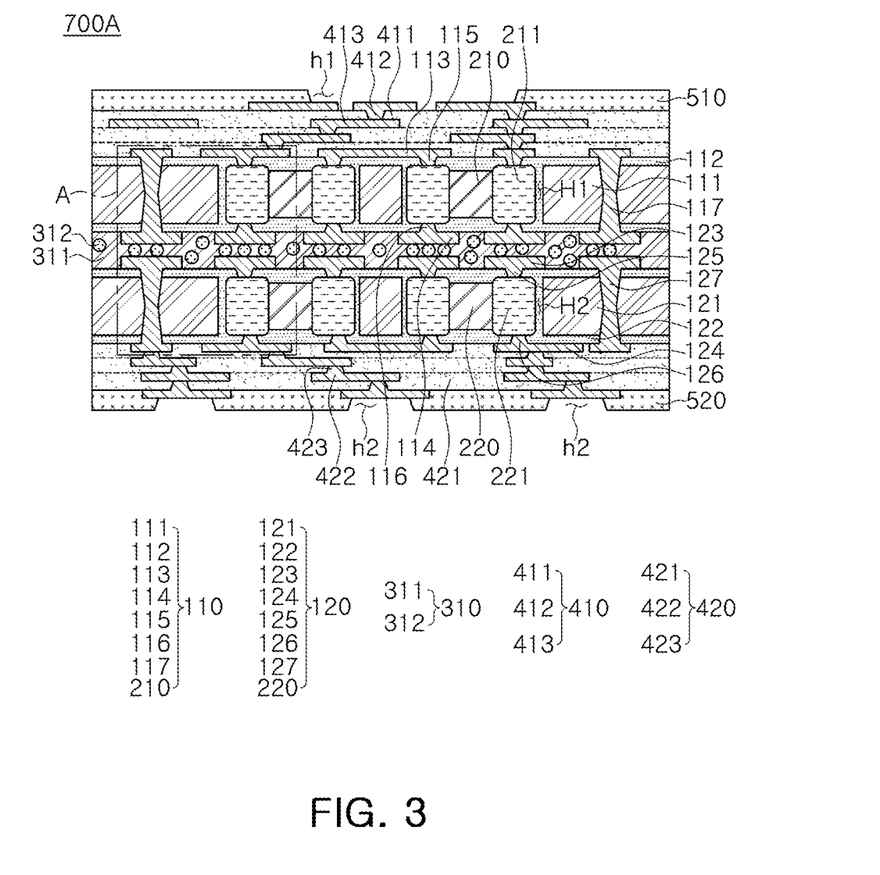
FIG. 3 is a schematic cross-sectional view of an example of a printed circuit board.

FIG. 3 is a cross-sectional view schematically illustrating an example of a printed circuit board.

Referring to the drawing, a printed circuit board 700A according to an example may include a first core portion 110 in which a first passive component 210 is embedded, a second core portion 120 in which a second passive component 220 is embedded, and a first bonding layer 310 disposed between the first and second core portions 110 and 120. If necessary, the printed circuit board 700A according to an example may further include a first build-up portion 410 disposed on the first core portion 110, a second build-up portion 420 disposed on the second core portion 120, a first solder resist layer 510 disposed on the first build-up portion 410 and/or a second solder resist layer 520 disposed on the second build-up portion 420.

On the other hand, in the case of a thin EPS structure, a structure in which passive components of similar thickness are embedded in a relatively thin core material may be easily adopted, but in the case of a large area board, since a core material thicker than passive components is introduced to secure rigidity, it is not easy to embed passive components. Therefore, it may be considered to manufacture the EPS structure by separately manufacturing a plurality of core layers in which passive components are embedded, respectively, and then bonding the same up and down. In this case, the passive components may be connected in the shortest path inside the board, and losses due to bypass connections are eliminated, and the degree of freedom of design may be increased. In addition, passive components may be connected adjacently in parallel to significantly increase PI characteristics. However, in the case of separately manufacturing and bonding a plurality of core layers in which passive components are respectively embedded, it may not be easy to introduce a via connection through a build-up process of the related art.

On the other hand, in the case of the printed circuit board 700A according to an example, the first and second core portions 110 and 120 in which the first and second passive components 210 and 220 are embedded respectively are bonded in a vertical direction, using the first bonding layer 310 containing first conductive particles 312, which may be electrically connected to the first and second passive components 210 and 220, thereby implementing the EPS structure more easily and thus improving PI characteristics. In addition, the degree of freedom of design may be increased.

Hereinafter, the components of the printed circuit board 700A according to an example will be described in more detail with reference to the drawings.

The first core portion 110 may be a core substrate including a first insulating layer 111 having a first through-hole H1, a first passive component 210 disposed in the first through-hole H1, a second insulating layer 112 disposed on the first insulating layer 111, covering at least a portion of the first passive component 210 and filling at least a portion of the first through-hole H1, first and second wiring layers 113 and 114 disposed on the upper and lower surfaces of the second insulating layer 112, respectively, first and second vias 115 and 116 penetrating at least a portion of the second insulating layer 112 and electrically connecting the first and second wiring layers 113 and 114 to the first passive component 210, respectively, and a first through-via 117 passing through the first and second insulating layers 111 and 112 and electrically connecting the first and second wiring layers 113 and 114.

The first insulating layer 111 may be a first core insulating layer. The first insulating layer 111 may include an insulating material, and examples of the insulating material may include insulating resins such as thermosetting resins such as epoxy resins or thermoplastic resins such as polyimide, materials in which these resins are mixed with inorganic fillers such as silica, or a resin impregnated into a core material such as glass fiber (glass cloth, glass fabric) together with an inorganic filler, for example, Copper Clad Laminate (CCL), but the present disclosure is not limited thereto. If necessary, a core insulating layer of another material such as a glass substrate may be introduced as the first insulating layer 111, or a metal core layer may be used as the first insulating layer 111.

The second insulating layer 112 may be a first encapsulant. The second insulating layer 112 may include an insulating material, and examples of the insulating material may include insulating resins such as thermosetting resins such as epoxy resins or thermoplastic resins such as polyimide, materials in which these resins are mixed with inorganic fillers such as silica, or a resin impregnated into a core material such as glass fiber (glass cloth, glass fabric) together with an inorganic filler, for example, for example, Ajinomoto Build-up Film (ABF), prepreg, or the like, but the present disclosure is not limited thereto. If necessary, the second insulating layer 112 may be comprised of a plurality of insulating layers, and the plurality of insulating layers may include the same or different insulating materials.

The first and second wiring layers 113 and 114 may be first and second core wiring layers. The first and second wiring layers 113 and 114 may include a metal material, and examples of the metal material may include copper (Cu), aluminum (Al), silver (Ag), tin (Sn), gold (Au), nickel (Ni), lead (Pb), titanium (Ti), or alloys thereof, but is not limited thereto. The first and second wiring layers 113 and 114 may include an electroless plating layer and an electrolytic plating layer, and may further include copper foil if necessary. The first and second wiring layers 113 and 114 may perform various functions according to the design of the corresponding layer. For example, the first and second wiring layers 113 and 114 may include a ground pattern, a power pattern, a signal pattern, and the like. In this case, the signal pattern may include various signals other than a ground pattern and a power pattern, for example, a data signal. Each of these patterns may include traces, planes, and/or pads. The first and second wiring layers 113 and 114 may be disposed on the upper and lower surfaces of the second insulating layer 112, respectively, and may be buried in the upper and lower surfaces, respectively, if necessary.

The first and second vias 114 and 115 may be first and second core vias. The first and second vias 114 and 115 may include a metal material, and as the metal material, copper (Cu), aluminum (Al), silver (Ag), tin (Sn), gold (Au), nickel (Ni), lead (Pb), titanium (Ti), or alloys thereof may be used, but the present disclosure is not limited thereto. The first and second vias 114 and 115 may be formed together with the first and second wiring layers 113 and 114, respectively, and may include an electroless plating layer and an electrolytic plating layer. Each of the first and second vias 114 and 115 may be a filled type in which a via hole is filled with a metal material, but is not limited thereto, and may also be a conformal type in which a metal material is disposed along the wall surface of the via hole. The first and second vias 114 and 115 may have tapered shapes in opposite directions on a cross section. The first and second vias 114 and 115 may perform various functions according to the design of the corresponding layer. For example, the first and second vias 114 and 115 may include ground vias, power vias, signal vias, and the like. In this case, the signal vias may include vias for transferring various signals, for example, data signals, excluding ground vias and power vias. The number of first and second vias 114 and 115 is not particularly limited, and may be formed to match the number of first electrodes 211 of the first passive component 210 described later.

The first through-via 117 may be a third core via. The first through-via 117 may include a metal material, and as the metal material, copper (Cu), aluminum (Al), silver (Ag), tin (Sn), gold (Au), nickel (Ni), lead (Pb), titanium (Ti), or alloys thereof may be used, but the present disclosure is not limited thereto. The first through-via 117 may be formed together with the first and second wiring layers 113 and 114 and may include an electroless plating layer and an electroplating layer. The first through-via 117 may be a filled type in which a via hole is filled with a metal material, but is not limited thereto, and may also be a conformal type in which a metal material is disposed along the wall surface of the via hole. The first through-via 117 may have an hourglass shape in cross section, but is not limited thereto and may have a rectangular shape in cross section. The first through-via 117 may perform various functions according to the design, and for example, may include ground vias, power vias, signal vias, and the like. In this case, the signal vias may include vias for transferring various signals, for example, data signals, excluding ground vias and power vias. The number of first through-vias 117 is not particularly limited.

The second core portion 120 may be a core substrate including a third insulating layer 121 having a second through-hole H2, a second passive component 220 disposed in the second through-hole H2, a fourth insulating layer 122 disposed on the third insulating layer 121, covering at least a portion of the second passive component 220 and filling at least a portion of the second through-hole H2, third and fourth wiring layers 123 and 124 disposed on the upper and lower surfaces of the fourth insulating layer 122, respectively, third and fourth vias 125 and 126 penetrating at least a portion of the fourth insulating layer 122 and electrically connecting the third and fourth wiring layers 123 and 124 to the second passive component 220, respectively, and a second through-via 127 passing through the third and fourth insulating layers 121 and 122 and electrically connecting the third and fourth wiring layers 123 and 124.

The third insulating layer 121 may be a second core insulating layer. The third insulating layer 121 may include an insulating material, and as the insulating material, insulating resins such as thermosetting resins such as epoxy resins or thermoplastic resins such as polyimide, materials in which these resins are mixed with inorganic fillers such as silica, or a resin impregnated into a core material such as glass fibers (Glass Cloth, glass fabric), for example, Copper Clad Laminate (CCL), or the like may be used, but the present disclosure is not limited thereto. If necessary, a core insulating layer of another material such as a glass substrate may be introduced as the third insulating layer 121, or a metal core layer may be used as the third insulating layer 121.

The fourth insulating layer 122 may be a second encapsulant. The fourth insulating layer 122 may include an insulating material, and as the insulating material, insulating resins such as thermosetting resins such as epoxy resins or thermoplastic resins such as polyimide, materials in which these resins are mixed with inorganic fillers such as silica, or a resin impregnated into a core material such as glass fibers (Glass Fiber, Glass Cloth, glass fabric), for example, Ajinomoto Build-up Film (ABF), prepreg, or the like may be used, but the present disclosure is not limited thereto. If necessary, the fourth insulating layer 122 may be comprised of a plurality of insulating layers, and the plurality of insulating layers may include the same or different insulating materials.

The third and fourth wiring layers 123 and 124 may be third and fourth core wiring layers. The third and fourth wiring layers 123 and 124 may include a metal material, and as the metal material, copper (Cu), aluminum (Al), silver (Ag), tin (Sn), gold (Au), nickel (Ni), lead (Pb), titanium (Ti), or alloys thereof may be used, but the present disclosure is not limited thereto. The third and fourth wiring layers 123 and 124 may include an electroless plating layer and an electrolytic plating layer, and may further include copper foil if necessary. The third and fourth wiring layers 123 and 124 may perform various functions according to the design of the corresponding layer. For example, the third and fourth wiring layers 123 and 124 may include a ground pattern, a power pattern, a signal pattern, and the like. In this case, the signal pattern may include various signals, for example, a data signal, other than a ground pattern and a power pattern. Each of these patterns may include traces, planes, and/or pads. The third and fourth wiring layers 123 and 124 may be disposed on the upper and lower surfaces of the fourth insulating layer 122, respectively, and may be buried in the upper and lower surfaces, respectively, if necessary.

The third and fourth vias 125 and 126 may be fourth and fifth core vias. The third and fourth vias 125 and 126 may include a metal material, such as copper (Cu), aluminum (Al), silver (Ag), tin (Sn), gold (Au), nickel (Ni), lead (Pb), titanium (Ti), or alloys thereof, but is not limited thereto. The third and fourth vias 125 and 126 may be formed together with the third and fourth wiring layers 123 and 124, respectively, and may include an electroless plating layer and an electrolytic plating layer. Each of the third and fourth vias 125 and 126 may be a filled type in which a via hole is filled with a metal material, but is not limited thereto, and may be a conformal type in which a metal material is disposed along the wall surface of the via hole. The third and fourth vias 125 and 126 may have tapered shapes in opposite directions on a cross section. The third and fourth vias 125 and 126 may perform various functions according to the design of the corresponding layer. For example, the third and fourth vias 125 and 126 may include ground vias, power vias, signal vias, and the like. In this case, the signal vias may include vias for transferring various signals, for example, data signals, excluding ground vias and power vias. The number of the third and fourth vias 125 and 126 is not particularly limited, and may be formed to match the number of second electrodes 221 of the second passive component 220 described later.

The second through-via 127 may be a sixth core via. The second through-via 127 may include a metal material, such as copper (Cu), aluminum (Al), silver (Ag), tin (Sn), gold (Au), nickel (Ni), lead (Pb), titanium (Ti), or alloys thereof, but is not limited thereto. The second through-via 127 may be formed together with the third and fourth wiring layers 123 and 124 and may include an electroless plating layer and an electrolytic plating layer. The second through-via 127 may be a filled type in which a via hole is filled with a metal material, but is not limited thereto, and may be a conformal type in which a metal material is disposed along the wall surface of the via hole. The second through-via 127 may have an hourglass shape in cross section, but is not limited thereto and may have a rectangular shape in cross section. The second through-via 127 may perform various functions according to the design, and for example, may include ground vias, power vias, signal vias, and the like. In this case, the signal vias may include vias for transferring various signals, for example, data signals, excluding ground vias and power vias. The number of second through-vias 127 is not particularly limited.

The first and second passive components 210 and 220 may be chip-type components such as inductors and capacitors, but are not limited thereto. In detail, each of the first and second passive components 210 and 220 may include a Multi Layer Ceramic Capacitor (MLCC), but is not limited thereto. The first and second passive components 210 and 220 may have first and second electrodes 211 and 221, respectively. The first and second electrodes 211 and 221 may be electrically connected to electrodes disposed inside the first and second passive components 210 and 220, and may also be electrically connected to the first to fourth wiring layers 113, 114, 123 and 124 through the first to fourth vias 115, 116, 125 and 126.

The first and second through-holes H1 and H2, the first and second passive components 210 and 220, and the first to fourth vias 115, 116, 125, and 126 may be plural, respectively. The plurality of first passive components 210 may be respectively disposed in the plurality of first through-holes H1 and respectively connected to the plurality of first and second vias 115 and 116. For example, the first electrode 211 of each of the plurality of first passive components 210 may be electrically connected to the plurality of first and second vias 115 and 116 on upper and lower sides, respectively. The plurality of second passive components 220 may be respectively disposed in the plurality of second through-holes H2 and respectively connected to the plurality of third and fourth vias 125 and 126. For example, the second electrode 221 of each of the plurality of second passive components 220 may be electrically connected to the plurality of third and fourth vias 125 and 126 on upper and lower sides, respectively.

Figure 4:
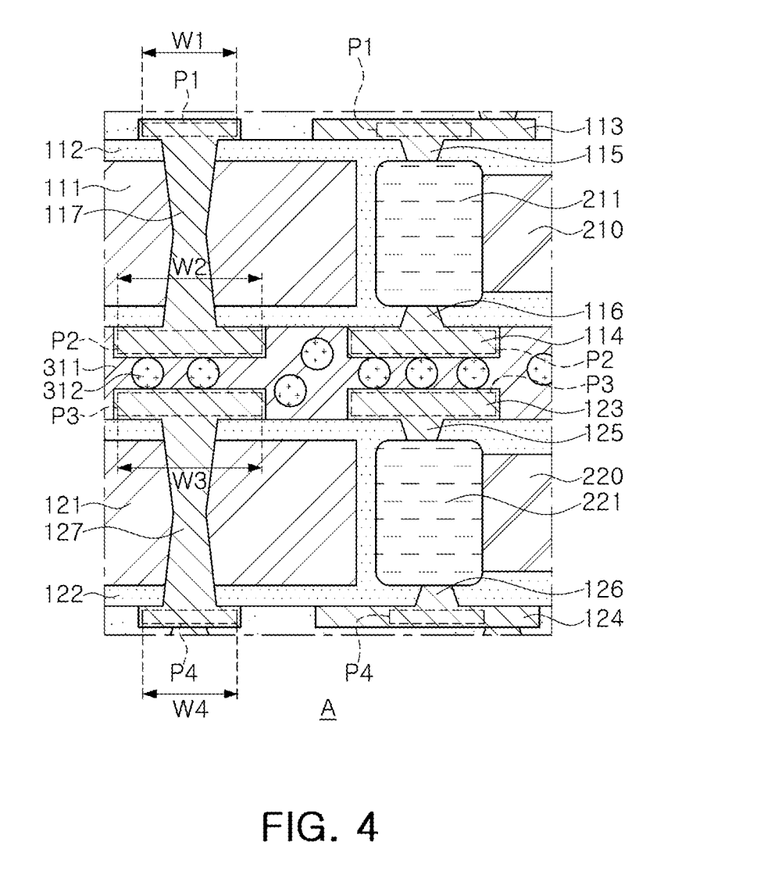
FIG. 4 is a schematic partial enlarged view of area A of the printed circuit board of FIG. 3.

The first bonding layer 310 may have a film form in which a plurality of first conductive particles 312 are dispersed in the first insulating resin 311. The first insulating resin 311 may include a thermally polymerizable compound such as an epoxy compound or a photopolymerizable compound such as an acrylate compound, but is not limited thereto. The first conductive particles 312 may include metal particles such as nickel (Ni), cobalt (Co), silver (Ag), copper (Cu), gold (Au) and palladium (Pd), alloy particles such as solder or the like, and/or metal-coated resin particles, and may use two or more types together, but the present disclosure is not limited thereto. An insulation treatment that does not interfere with conduction characteristics may be applied to the surface of the first conductive particles 312. Examples of the insulation treatment include, but are not limited to, adhesion of insulating fine particles or coating of an insulating resin. In detail, the first bonding layer 310 may include a known anisotropic conductive film (ACF), but is not limited thereto. The first conductive particle 312 may be electrically connected to the first and second passive components 210 and 220. For example, the first conductive particle 312 may be connected to the first passive component 210 through the second via 116 and the second wiring layer 114 and connected to the second passive component 220 through the third via 125 and the third wiring layer 123. The thickness of the first bonding layer 310 may be adjusted by adjusting the diameter of the first conductive particles 312. The first bonding layer 310 may be disposed between the first and second core portions 110 and 120 and bonded thereto under high temperature and high pressure conditions. In this process, molding and curing of the first insulating resin 311 may be performed.

The second and third wiring layers 114 and 123 may be at least partially buried in the first bonding layer 310 respectively and may be electrically connected to each other through the first conductive particles 312. In detail, the first to fourth wiring layers 113, 114, 123 and 124 may include first to fourth pads P1, P2 P3 and P4 connected to the first to fourth vias 115, 116, 125, and 126, respectively. In this case, the second and third pads P2 and P3 are buried in the upper and lower sides of the first bonding layer 310, respectively, and may be electrically connected to each other through the first conductive particles 312. Accordingly, the first and second electrodes 211 and 221 may be electrically connected to each other through the second and fourth vias 115 and 126, the second and third pads P2 and P3, and the first conductive particle 312. For example, the first and second passive components 210 and 220 may be connected in parallel. In addition, the first and fourth wiring layers 113 and 124 may be electrically connected to each other through the first and second through-vias 117 and 127, the second and third pads P2 and P3, and the first conductive particles 312.

Maximum widths W2 and W3 on respective cross sections of the second and third pads P2 and P3 may be greater than maximum widths W1 and W4 on respective cross sections of the first and fourth pads P1 and P4. In this case, risks such as misalignment of the first and second core portions 110 and 120 may be reduced. On the other hand, the maximum width may be measured using a scanning microscope or an optical microscope based on the polished or cut cross section of the printed circuit board 700A. The second and third pads P2 and P3 may respectively be protruding pads, and thus electrical connection through the first conductive particles 312 may be more easily obtained due to pressure concentration therebetween.

The first build-up portion 410 may be a build-up substrate, disposed on the first core portion 110 and for example, including a sixth insulating layer 411 disposed on the first core portion 110, a seventh wiring layer 412 disposed on or in the sixth insulating layer 411, and a fifth via 413 penetrating at least a portion of the sixth insulating layer 411 and connected to the seventh wiring layer 412.

The sixth insulating layer 411 may be a first build-up insulating layer. The sixth insulating layer 411 may include an insulating material, and the insulating material may be an insulating resin such as a thermosetting resin such as epoxy resin or a thermoplastic resin such as polyimide, materials in which these resins are mixed with inorganic fillers such as silica, or a resin impregnated into a core material such as glass fiber (glass cloth, glass fabric) together with an inorganic filler, for example, Ajinomoto Build-up Film (ABF), prepreg, or the like, but the present disclosure is not limited thereto. If necessary, the sixth insulating layer 411 may include a Photo Imageable Dielectric (PID). The sixth insulating layer 411 may be comprised of a plurality of insulating layers, and the plurality of insulating layers may include the same or different insulating materials.

The seventh wiring layer 412 may be a first build-up wiring layer. Examples of the seventh wiring layer 412 may include a metal material, such as copper (Cu), aluminum (Al), silver (Ag), tin (Sn), gold (Au), nickel (Ni), lead (Pb), titanium (Ti), or alloys thereof, but is not limited thereto. The seventh wiring layer 412 may include an electroless plating layer and an electrolytic plating layer, and may further include copper foil if necessary. The seventh wiring layer 412 may perform various functions according to the design of the corresponding layer. For example, the seventh wiring layer 412 may include a ground pattern, a power pattern, a signal pattern, and the like. In this case, the signal pattern may include various signals, for example, a data signal, other than a ground pattern and a power pattern. Each of these patterns may include traces, planes, and/or pads. The seventh wiring layer 412 may be comprised of a plurality of wiring layers, and the respective wiring layers may be disposed on or within respective insulating layer of the sixth insulating layer 411.

The fifth via 413 may be a first build-up via. The fifth via 413 may include a metal material, such as copper (Cu), aluminum (Al), silver (Ag), tin (Sn), gold (Au), nickel (Ni), lead (Pb), titanium (Ti), or alloys thereof, but is not limited thereto. The fifth via 413 may be formed together with the seventh wiring layer 412 and may include an electroless plating layer and an electrolytic plating layer. Each of the fifth vias 413 may be a filled type in which a via hole is filled with a metal material, but is not limited thereto, and may be a conformal type in which a metal material is disposed along the wall surface of the via hole. The fifth via 413 may have a tapered shape in cross section. The fifth via 413 may perform various functions according to the design of the corresponding layer. For example, the fifth via 413 may include ground vias, power vias, signal vias, and the like. In this case, the signal vias may include vias for transferring various signals, for example, data signals, excluding ground vias and power vias. The fifth vias 413 may be disposed in multiple layers, and may pass through respective insulating layers of the sixth insulating layer 411, for example. The fifth via 413 may provide an electrical connection between the seventh wiring layers 412 disposed on different layers and/or an electrical connection path between the first and seventh wiring layers 113 and 412.

The second build-up portion 420 may be a build-up substrate, disposed on the second core portion 120 and including, for example, a seventh insulating layer 421 disposed below the second core portion 120, an eighth wiring layer 422 disposed on or in the seventh insulating layer 421, and a sixth via 423 penetrating at least a portion of the seventh insulating layer 421 and connected to the eighth wiring layer 422.

The seventh insulating layer 421 may be a second build-up insulating layer. The seventh insulating layer 421 may include an insulating material, and as the insulating material, insulating resins such as thermosetting resins such as epoxy resins or thermoplastic resins such as polyimide, materials in which these resins are mixed with inorganic fillers such as silica, or a resin impregnated into a core material such as glass fibers (Glass Fiber, Glass Cloth, glass fabric), for example, Ajinomoto Build-up Film (ABF), prepreg, or the like may be used, but the present disclosure is not limited thereto. If necessary, the seventh insulating layer 421 may include a Photo Imageable Dielectric (PID). The seventh insulating layer 421 may be comprised of a plurality of insulating layers, and the plurality of insulating layers may include the same or different insulating materials.

The eighth wiring layer 422 may be a second build-up wiring layer. The eighth wiring layer 422 may include a metal material, such as copper (Cu), aluminum (Al), silver (Ag), tin (Sn), gold (Au), nickel (Ni), lead (Pb), titanium (Ti), or alloys thereof, but is not limited thereto. The eighth wiring layer 422 may include an electroless plating layer and an electrolytic plating layer, and may further include copper foil if necessary. The eighth wiring layer 422 may perform various functions according to the design of the corresponding layer. For example, the eighth wiring layer 422 may include a ground pattern, a power pattern, a signal pattern, and the like. In this case, the signal pattern may include various signals, for example, a data signal, other than a ground pattern and a power pattern. Each of these patterns may include traces, planes, and/or pads. The eighth wiring layer 422 may be comprised of a plurality of wiring layers, and the respective wiring layers may be disposed on or within respective insulating layers of the seventh insulating layer 421.

The sixth via 423 may be a second build-up via. The sixth via 423 may include a metal material, such as copper (Cu), aluminum (Al), silver (Ag), tin (Sn), gold (Au), nickel (Ni), lead (Pb), titanium (Ti), or alloys thereof, but is not limited thereto. The sixth via 423 may be formed together with the eighth wiring layer 422 and may include an electroless plating layer and an electrolytic plating layer. Each of the sixth vias 423 may be a filled type in which a via hole is filled with a metal material, but is not limited thereto, and may be a conformal type in which a metal material is disposed along the wall surface of the via hole. The sixth via 423 may have a tapered shape in cross section. The sixth via 423 may perform various functions according to the design of the corresponding layer. For example, the sixth via 423 may include ground vias, power vias, signal vias, and the like. In this case, the signal vias may include vias for transferring various signals, for example, data signals, excluding ground vias and power vias. The sixth via 423 may be disposed in multiple layers, and may pass through a respective insulating layer of the seventh insulating layer 421, for example. The sixth via 423 may provide an electrical connection between the eighth wiring layers 422 disposed on different layers and/or an electrical connection path between the fourth and eighth wiring layers 124 and 422.

The first solder resist layer 510 may be disposed on the first build-up portion 410, for example, above the first build-up portion 410, and may have a first opening h1 exposing at least a portion of the seventh wiring layer 412, for example, an uppermost seventh wiring layer among the seventh wiring layers 412. The first solder resist layer 510 may include a known solder resist material and may include a photosensitive insulating material, but is not limited thereto.

The second solder resist layer 520 may be disposed on the second build-up portion 420, for example, below the second build-up portion 420, and may have a second opening h2 exposing at least a portion of the eighth wiring layer 422, for example, a lowermost eighth wiring layer 422 among the eighth wiring layers 422. The second solder resist layer 520 may include a known solder resist material and may include a photosensitive insulating material, but is not limited thereto.

Figure 5:
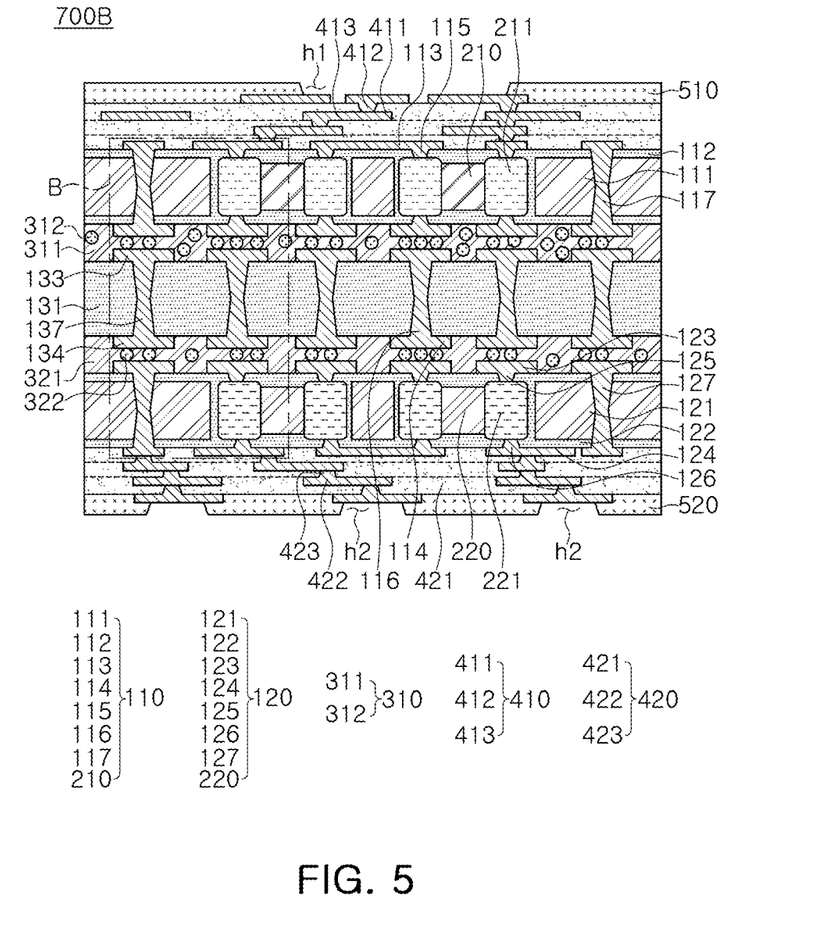
FIG. 5 is a schematic cross-sectional view of another example of a printed circuit board.

FIG. 5 is a cross-sectional view schematically illustrating another example of a printed circuit board.

Figure 6:
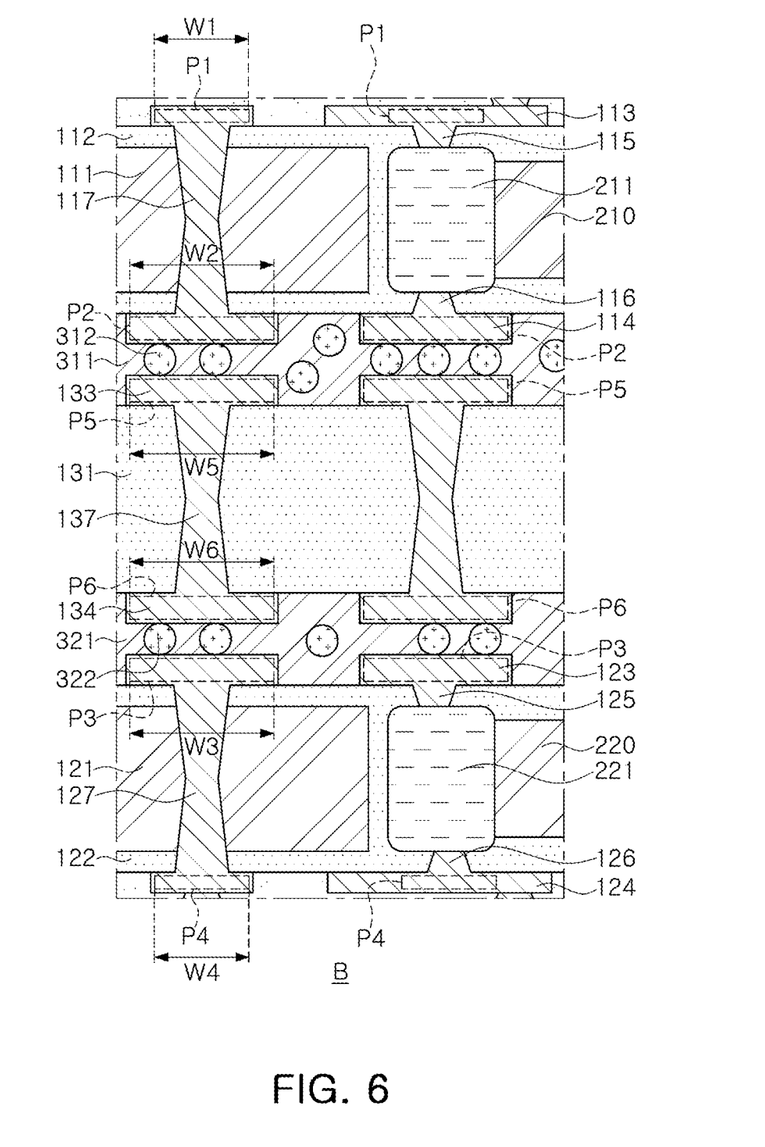
FIG. 6 is a schematic partial enlarged view of area B of the printed circuit board of FIG. 5.

FIG. 6 is a schematic partial enlarged view of region B of the printed circuit board of FIG. 5.

Referring to the drawings, a printed circuit board 700B according to another example may include a first core portion 110 having a first passive component 210 embedded therein, a second core portion 120 having a second passive component 220 embedded therein, a third core portion 130, a first bonding layer 310 disposed between the first and third core portions 110 and 130, and a second bonding layer 320 disposed between the second and third core portions 120 and 130. If necessary, the printed circuit board 700B according to the example may further include a first build-up portion 410 disposed on the first core portion 110, a second build-up portion 420 disposed on the second core portion 120, a first solder resist layer 510 disposed on the first build-up portion 410, and/or a second solder resist layer 520 disposed on the second build-up portion 420.

In the case of the printed circuit board 700B according to the example, the first and second core portions 110 and 120 in which the first and second passive components 210 and 220 are respectively embedded, and the third core portion 130 disposed therebetween, may also be bonded up and down, using first and second bonding layers 310 and 320 including first and second conductive particles 312 and 322 capable of being electrically connected to the first and second passive components 210 and 220, thereby implementing the EPS structure more easily, and thus, improving the PI characteristics. In addition, the degree of freedom of design may be increased.

Hereinafter, components of the printed circuit board 700B according to another example will be described in more detail with reference to the drawings.

The third core portion 130 may be a core substrate including a fifth insulating layer 131, fifth and sixth wiring layers 133 and 134 respectively disposed on the upper and lower surfaces of the fifth insulating layer 131, and a third through-via 137 penetrating the fifth insulating layer 131 and electrically connecting the fifth and sixth wiring layers 133 and 134. The third core portion 130 may be disposed between the first and second core portions 110 and 120, and therefore, a relatively thicker multi-core may be implemented.

The fifth insulating layer 131 may be a third core insulating layer. The fifth insulating layer 111 may include an insulating material, and the insulating material may be an insulating resin such as a thermosetting resin such as epoxy resin or a thermoplastic resin such as polyimide, a material in which these resins are mixed with inorganic fillers such as silica, or a resin impregnated into a core material such as glass fiber (glass cloth, glass fabric) together with an inorganic filler, for example, Copper Clad Laminate (CCL), but the present disclosure is not limited thereto. If necessary, a core insulating layer of another material such as a glass substrate may be introduced as the fifth insulating layer 131, or a metal core layer may be used as the fifth insulating layer 131.

The fifth and sixth wiring layers 133 and 134 may be fifth and sixth core wiring layers. The fifth and sixth wiring layers 133 and 134 may include a metal material, such as copper (Cu), aluminum (Al), silver (Ag), tin (Sn), gold (Au), nickel (Ni), lead (Pb), titanium (Ti), or alloys thereof, but the present disclosure is not limited thereto. The fifth and sixth wiring layers 133 and 134 may include an electroless plating layer and an electrolytic plating layer, and may further include copper foil if necessary. The fifth and sixth wiring layers 133 and 134 may perform various functions according to the design of the corresponding layer. For example, the fifth and sixth wiring layers 133 and 134 may include a ground pattern, a power pattern, a signal pattern, and the like. In this case, the signal pattern may include various signals, for example, a data signal, other than a ground pattern and a power pattern. Each of these patterns may include traces, planes, and/or pads. The fifth and sixth wiring layers 133 and 134 may be disposed on the upper and lower surfaces of the fifth insulating layer 131, respectively, and may be buried in the upper and lower surfaces, respectively, if necessary.

The third through-via 137 may be a seventh core via. The third through-via 137 may include a metal material, such as copper (Cu), aluminum (Al), silver (Ag), tin (Sn), gold (Au), nickel (Ni), lead (Pb), titanium (Ti), or alloys thereof, but is not limited thereto. The third through-via 137 may be formed together with the fifth and sixth wiring layers 133 and 134 and may include an electroless plating layer and an electrolytic plating layer. The third through-via 137 may be a filled type in which a via hole is filled with a metal material, but is not limited thereto, and may be a conformal type in which a metal material is disposed along the wall surface of the via hole. The third through-via 137 may have an hourglass shape in cross section, but is not limited thereto and may have a rectangular shape in cross section. The third through-via 137 may perform various functions according to the design. For example, the third through-via 137 may include ground vias, power vias, signal vias, and the like. In this case, the signal vias may include vias for transferring various signals, for example, data signals, excluding ground vias and power vias. The number of third through-vias 137 is not particularly limited.

The second bonding layer 320 may have a film form in which a plurality of second conductive particles 322 are dispersed in the second insulating resin 321. The second insulating resin 321 may include a thermally polymerizable compound such as an epoxy compound or a photopolymerizable compound such as an acrylate compound, but is not limited thereto. The second conductive particles 322 may include metal particles such as nickel (Ni), cobalt (Co), silver (Ag), copper (Cu), gold (Au), and palladium (Pd), alloy particles such as solder, and/or metal-coated resin particles, etc., and may use two or more types together, but is not limited thereto. An insulation treatment that does not interfere with conduction characteristics may be applied to the surface of the second conductive particles 322. Examples of the insulation treatment may include, but are not limited to, adhesion of insulating fine particles or coating of an insulating resin. In detail, the second bonding layer 320 may include a known anisotropic conductive film (ACF), but is not limited thereto. The second conductive particles 322 may be electrically connected to the first and second passive components 210 and 220. The thickness of the second bonding layer 320 may be adjusted by adjusting the diameter of the second conductive particles 322. The second bonding layer 320 may be disposed between the second and third core portions 120 and 130 and bonded thereto under a high-temperature and high-pressure condition. In this process, molding and curing of the second insulating resin 321 may proceed.

The second and fifth wiring layers 114 and 133 may be respectively at least partially buried in the first bonding layer 310 and electrically connected to each other through the first conductive particles 312. The third and sixth wiring layers 123 and 134 may be respectively at least partially buried in the second bonding layer 320 and electrically connected to each other through the second conductive particles 322. In detail, the first to sixth wiring layers 113, 114, 123, 124, 133, and 134 may include first to sixth pads P1, P2, P3, P4, P5, and P6 connected to the first to fourth vias 115, 116, 125 and 126 and the third through-via 137, respectively. In this case, the second and fifth pads P2 and P5 may be buried in the upper and lower sides of the first bonding layer 310 respectively and may be electrically connected to each other through the first conductive particles 312. In addition, the third and sixth pads P3 and P6 may be buried in the upper and lower sides of the second bonding layer 320 respectively and may be electrically connected to each other through the second conductive particles 322. Accordingly, the first and second electrodes 211 and 221 may be electrically connected to each other through the second and fourth vias 115 and 126, the third through-via 137, the second, third, fifth and sixth pads P2, P3, P5 and P6, and the first and second conductive particles 312 and 322. For example, the first and second passive components 210 and 220 may be connected in parallel. In addition, the first and fourth wiring layers 113 and 124 may be electrically connected to each other through the first to third through-vias 117, 127 and 137, the second, third, fifth and sixth pads P2, P3, P5 and P6, and the first and second conductive particles 312 and 322.

Maximum widths $W2$, $W3$, $W5$, and $W6$ on respective cross sections of the second, third, fifth, and sixth pads P2, P3, P5, and P6 may be greater than maximum widths $W1$ and $W4$ on respective cross sections of the first and fourth pads P1 and P4. In this case, risks such as misalignment of the first to third core portions 110, 120, and 130 may be reduced. On the other hand, the maximum width may be measured using a scanning microscope or an optical microscope based on the polished or cut cross section of the printed circuit board 700B. The second, third, fifth, and sixth pads P2, P3, P5, and P6 may be protruding pads, respectively, and thus, electrical connection through the first and second conductive particles 312 and 322 may be relatively easier by pressure concentration therebetween.

Other descriptions are substantially the same as those described in the printed circuit board 700A according to the above-described example, and thus redundant descriptions are omitted.

As set forth above, according to an embodiment, an EPS structure may be more easily implemented, and therefore, a printed circuit board in which PI characteristics may be improved may be provided.

In the present disclosure, the meaning of being connected is a concept including not only being directly connected but also being indirectly connected. In addition, expressions such as first and second are used to distinguish one component from another, and do not limit the order and/or importance of the components. In some cases, without departing from the scope of rights, the first component may be named a second component, and similarly, the second element may be referred to as the first element.

The expression "an (one) example" used in the present disclosure does not mean the same embodiments, and is provided to emphasize and describe different unique characteristics. However, the examples presented above are not excluded from being implemented in combination with features of other examples. For example, even if a matter described in a specific example is not described in another example, it may be understood as a description related to another example, unless there is a description contrary to or contradictory to the matter in the other example.

Terms used in this disclosure are only used to describe an example, and are not intended to limit the disclosure. In this case, singular expressions include plural expressions unless the context clearly indicates otherwise.

While example embodiments have been shown and described above, it will be apparent to those skilled in the art that modifications and variations could be made without departing from the scope of the present disclosure as defined by the appended claims.

What is claimed is:

1. A printed circuit board comprising:
   a first core portion in which a first passive component is embedded;
   a second core portion in which a second passive component is embedded; and
   a first bonding layer disposed between the first and second core portions and including first conductive particles connected to the first and second passive components.

2. The printed circuit board of claim 1, wherein the first bonding layer includes an anisotropic conductive film (ACF).

3. The printed circuit board of claim 1, wherein the first and second passive components respectively include a Multi-Layer Ceramic Capacitor (MLCC).

4. The printed circuit board of claim 1, wherein the first core portion includes a first insulating layer having a first through-hole, the first passive component disposed in the first through-hole, a second insulating layer disposed on the first insulating layer, covering at least a portion of the first passive component, and disposed in at least a portion of the first through-hole, first and second wiring layers disposed on upper and lower surfaces of the second insulating layer, respectively, first and second vias respectively penetrating at least a portion of the second insulating layer and respectively connecting the first and second wiring layers to the first passive component, and a first through-via passing through the first and second insulating layers and connecting the first and second wiring layers.

5. The printed circuit board of claim 4, wherein the second core portion includes a third insulating layer having a second through-hole, the second passive component disposed in the second through-hole, a fourth insulating layer disposed on the third insulating layer, covering at least a portion of the second passive component and disposed in at least a portion of the second through-hole, third and fourth wiring layers disposed on upper and lower surfaces of the fourth insulating layer, respectively, third and fourth vias respectively penetrating at least a portion of the fourth insulating layer and respectively connecting the third and fourth wiring layers to the second passive component, and a second through-via passing through the third and fourth insulating layers and connecting the third and fourth wiring layers.

6. The printed circuit board of claim 5, wherein the first and second through-holes, the first and second passive components, and the first to fourth vias are plural, respectively,
   wherein a plurality of the first passive components are respectively disposed in a plurality of the first through-holes and respectively connected to a plurality of the first and second vias, and
   a plurality of the second passive components are respectively disposed in a plurality of the second through-holes and respectively connected to a plurality of the third and fourth vias.

7. The printed circuit board of claim 5, wherein the second and third wiring layers are at least partially buried in the first bonding layer and connected to each other through the first conductive particles.

8. The printed circuit board of claim 7, wherein the first to fourth wiring layers include first to fourth pads connected to the first to fourth vias, respectively, and
   a maximum width on a cross section of each of the second and third pads is greater than a maximum width on a cross section of each of the first and fourth pads.

9. The printed circuit board of claim 5, further comprising:
   a third core portion including a fifth insulating layer, fifth and sixth wiring layers disposed on upper and lower surfaces of the fifth insulating layer respectively, and a third through via penetrating the fifth insulating layer and connecting the fifth and sixth wiring layers; and
   a second bonding layer disposed between the first and second core portions and including second conductive particles connected to the first and second passive components,
   wherein the first bonding layer is disposed between the first and third core portions, and
   the second bonding layer is disposed between the second and third core portions.

10. The printed circuit board of claim 9, wherein the first and second bonding layers respectively include an anisotropic conductive film (ACF).

11. The printed circuit board of claim 9, wherein the second and fifth wiring layers are respectively at least partially buried in the first bonding layer and connected to each other through the first conductive particles, and
   the third and sixth wiring layers are respectively at least partially buried in the second bonding layer and connected to each other through the second conductive particles.

12. The printed circuit board of claim 11, wherein the first to sixth wiring layers include first to sixth pads connected to the first to fourth vias and the third through-via, respectively, and
   a maximum width on a cross section of each of the second, third, fifth and sixth pads is greater than a maximum width on a cross section of each of the first and fourth pads.

13. The printed circuit board of claim 5, further comprising:
   a first build-up portion including a sixth insulating layer disposed on the first core portion, a seventh wiring layer disposed on or in the sixth insulating layer, and a fifth via penetrating at least a portion of the sixth insulating layer and connected to the seventh wiring layer;
   a second build-up portion including a seventh insulating layer disposed on the second core portion, an eighth wiring layer disposed on or in the seventh insulating layer, and a sixth via penetrating at least a portion of the seventh insulating layer and connected to the eighth wiring layer;
   a first solder resist layer disposed on the first build-up portion and having a first opening exposing at least a portion of the seventh wiring layer; and a second solder resist layer disposed on the second build-up portion and having a second opening exposing at least a portion of the eighth wiring layer.

14. The printed circuit board of claim 5, wherein the first bonding layer includes one or more additional conductive particles spaced apart from the second and third wiring layers.

15. A printed circuit board comprising:
a first core substrate including a first core insulating layer having a first through-hole, a first passive component disposed in the first through-hole and including a first electrode, a first encapsulant covering at least a portion of each of the first core insulating layer and the first passive component, first and second core wiring layers disposed on upper and lower surfaces of the first encapsulant, respectively, first and second core vias respectively passing through at least a portion of the first encapsulant, on upper and lower sides of the first passive component, and respectively connecting the first electrode to the first and second core wiring layers, and a third core via passing through the first core insulating layer and the first encapsulant and connecting the first and second core wiring layers;
a second core substrate including a second core insulating layer having a second through-hole, a second passive component disposed in the second through-hole and including a second electrode, a second encapsulant covering at least a portion of each of the second core insulating layer and the second passive component, third and fourth core wiring layers disposed on upper and lower surfaces of the second encapsulant respectively, fourth and fifth core vias respectively passing through at least a portion of the second encapsulant, on upper and lower sides of the second passive component, and respectively connecting the second electrode to the third and fourth core wiring layers, and a sixth core via passing through the second core insulating layer and the second encapsulant and connecting the third and fourth core wiring layers; and
a first bonding layer disposed between the first and second core substrates and including first conductive particles connected to the first and second electrodes.

16. The printed circuit board of claim 15, further comprising:
a third core substrate including a third core insulating layer, fifth and sixth core wiring layers disposed on upper and lower surfaces of the third core insulating layer respectively, and a seventh core via passing through the third core insulating layer and connecting the fifth and sixth core wiring layers; and
a second bonding layer disposed between the first and second core substrates and including second conductive particles connected to the first and second electrodes,
wherein the first bonding layer is disposed between the first and third core substrates, and
the second bonding layer is disposed between the second and third core substrates.

17. The printed circuit board of claim 16, further comprising:
a first build-up substrate including a plurality of first build-up insulating layers disposed on the first core substrate, a plurality of first build-up wiring layers respectively disposed on or in the plurality of first build-up insulating layers, and a plurality of first build-up vias respectively penetrating the plurality of first build-up insulating layers;
a second build-up substrate including a plurality of second build-up insulating layers disposed below the second core substrate, a plurality of second build-up wiring layers respectively disposed on or within the plurality of second build-up insulating layers, and a plurality of second build-up vias respectively penetrating the plurality of second build-up insulating layers;
a first solder resist layer disposed on the first build-up substrate and having a first opening exposing at least a portion of an uppermost first build-up wiring layer among the plurality of first build-up wiring layers; and
a second solder resist layer disposed below the first build-up substrate and having a second opening exposing at least a portion of a lowermost second build-up wiring layer among the plurality of second build-up wiring layers.

18. A printed circuit board comprising:
a bonding layer including an insulating resin and conductive particles randomly dispersed in the insulating resin;
a first passive component disposed on one side of the bonding layer; and
a second passive component disposed on another side of the bonding layer such that the bonding layer is disposed between the first passives component and the second passive component,
wherein the first passive component and the second passive component at least partially overlap each other in a laminating direction of the printed circuit board, and are connected to each other through at least one or more of the conductive particles disposed between the first passive component and the second passive component.

19. The printed circuit board of claim 18, further comprising:
a first insulating layer in which the first passive component is disposed;
first and second wiring layers disposed on upper and lower surfaces of the first insulating layer, respectively;
first and second vias respectively connecting the first and second wiring layers to the first passive component;
a third insulating layer in which the second passive component is disposed;
third and fourth wiring layers disposed on upper and lower surfaces of the third insulating layer, respectively; and
third and fourth vias respectively connecting the third and fourth wiring layers to the second passive component.

20. The printed circuit board of claim 19, wherein the second and third wiring layers are at least partially buried in the bonding layer and connected to each other through the at least one or more of the conductive particles.

21. The printed circuit board of claim 20, wherein at least another one or more of the conductive particles are spaced apart from the second and third wiring layers.

* * * * *